United States Patent
Jeong et al.

(10) Patent No.: US 11,423,963 B2
(45) Date of Patent: Aug. 23, 2022

(54) INTEGRATED CIRCUIT AND MEMORY

(71) Applicants: SK hynix Inc., Gyeonggi-do (KR); Seoul National University R&DB Foundation, Seoul (KR)

(72) Inventors: Deog-Kyoon Jeong, Seoul (KR); Han-Gon Ko, Seoul (KR); Chan-Ho Kye, Seoul (KR); So-Yeong Shin, Gyeonggi-do (KR)

(73) Assignees: SK hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/686,941

(22) Filed: Nov. 18, 2019

(65) Prior Publication Data
US 2020/0211605 A1    Jul. 2, 2020

(30) Foreign Application Priority Data
Dec. 26, 2018  (KR) .......................... 10-2018-0169385

(51) Int. Cl.
*G11C 7/22*     (2006.01)
*G11C 7/10*     (2006.01)
*H03L 7/081*    (2006.01)
*H03L 7/197*    (2006.01)

(52) U.S. Cl.
CPC ............ *G11C 7/222* (2013.01); *G11C 7/1006* (2013.01); *G11C 7/1066* (2013.01); *G11C 7/1093* (2013.01); *H03L 7/0814* (2013.01); *H03L 7/1974* (2013.01)

(58) Field of Classification Search
CPC ..... G11C 7/222; G11C 7/1009; G11C 7/1066; G11C 7/1093; H03L 7/0814; H03L 7/1974
See application file for complete search history.

(56) References Cited

U.S. PATENT DOCUMENTS

| | | | | |
|---|---|---|---|---|
| 7,525,355 B2 * | 4/2009 | Huang | ................. | H03K 5/1565 327/149 |
| 7,844,023 B2 * | 11/2010 | Farjad-Rad | ........... | H03L 7/0812 327/307 |
| 9,356,611 B1 | 5/2016 | Shyu et al. | | |
| 10,530,371 B2 * | 1/2020 | Jeon | ........................ | H03L 7/087 |

OTHER PUBLICATIONS

Johnson, M.G. et al, A Variable Delay Line PLL for CPU-Coprocessor Synchronization, IEEE Journal of Solid-State Circuits, Oct. 1988, pp. 1218-1223, vol. 23, No. 5, MIPS Computer Systems, Inc., Sunnyvale, CA 94086.

* cited by examiner

*Primary Examiner* — Diana J. Cheng
*Assistant Examiner* — Colleen J O Toole
(74) *Attorney, Agent, or Firm* — IP & T Group LLP

(57) ABSTRACT

An integrated circuit includes: a first path suitable for transferring an input signal from a first point to a second point; a second path suitable for transferring the input signal from the second point to a third point; a first phase comparator suitable for comparing an edge of the input signal at the first point with an edge of the input signal at the second point; and a second phase comparator suitable for comparing an edge of the input signal at the second point with an edge of the input signal at the third point, wherein the first path includes a first delay circuit whose delay value is adjusted based on a comparison result of the first phase comparator, and the second path includes a second delay circuit whose delay value is adjusted based on a comparison result of the second phase comparator.

9 Claims, 3 Drawing Sheets

INTEGRATED CIRCUIT AND MEMORY

CROSS-REFERENCE TO RELATED APPLICATIONS

The present application claims priority of Korean Patent Application No. 10-2018-0169385, filed on Dec. 26, 2018, which is incorporated herein by reference in its entirety.

BACKGROUND

1. Field

Various embodiments of the present invention relate to an integrated circuit and a memory.

2. Description of the Related Art

In a clock-based system operating at a high speed, a strobe signal is used for correctly recognizing data transferred and received between integrated circuit chips. That is, when data are transferred and received between integrated circuit chips, a strobe signal is also transferred and received along with the data.

For example, almost memories are adopting data strobe signals for strobing data, when the data are transferred and received. Data and the data strobe signals are required to be correctly aligned for securing the signal integrity in data transfer and reception.

FIG. 1 is a timing diagram illustrating data DQ and data strobe signals DQS_t and DQS_c. Specifically, FIG. 1 shows that edges of the data strobe signals DQS_t and DQS_c are aligned to a center of the data DQ. In order to correctly align the data DQ with the data strobe signals DQS_t and DQS_c, a training process is performed between a memory and a memory controller when initializing the memory device. However, even after the training process, as a delay value of a path inside the memory, through which the data strobe signal is transferred, is changed by the PVT (i.e., Process, Voltage, Temperature) variations, the alignment between the data DQ and the strobe signals DQS_t and DQS_c may be distorted again.

SUMMARY

Embodiments of the present invention are directed to a technology for uniformly locking a delay value of a strobe signal.

In accordance with an embodiment of the present invention, an integrated circuit includes: a first path suitable for transferring an input signal from a first point to a second point; a second path suitable for transferring the input signal from the second point to a third point; a first phase comparator suitable for comparing an edge of the input signal at the first point with an edge of the input signal at the second point; and a second phase comparator suitable for comparing an edge of the input signal at the second point with an edge of the input signal at the third point, wherein the first path includes a first delay circuit whose delay value is adjusted based on a comparison result of the first phase comparator, and the second path includes a second delay circuit whose delay value is adjusted based on a comparison result of the second phase comparator.

In accordance with another embodiment of the present invention, a memory includes: a first path suitable for transferring a first data strobe signal and a second data strobe signal from a first point to a second point; a second path suitable for transferring the first and second data strobe signals from the second point to a third point; a first phase comparator suitable for comparing an edge of one strobe signal between the first data strobe signal and the second data strobe signal at the first point with an edge of one strobe signal between the first data strobe signal and the second data strobe signal at the second point; a second phase comparator suitable for comparing an edge of one strobe signal between the first data strobe signal and the second data strobe signal at the second point with an edge of one strobe signal among the first and second data strobe signals at the third point; a data receiving circuit suitable for receiving data based on the first and second data strobe signals at the third point; and wherein the first path includes a first delay circuit whose delay value is adjusted based on a comparison result of the first phase comparator, and the second path includes a second delay circuit whose delay value is adjusted based on a comparison result of the second phase comparator.

In accordance with still another embodiment of the present invention, a memory includes: a data pad and a data strobe signal pad; a data receiving circuit suitable for receiving data externally received through the data pad based on a data strobe signal; first and second delay circuits coupled in series, suitable for delaying the data strobe signal externally received through the data strobe signal pad to generate the data strobe signal provided to the data receiving circuit; a first phase comparator suitable for comparing a phase of the strobe signal at the data strobe signal pad with a phase of the strobe signal outputted from the first delay circuit; and a second phase comparator suitable for comparing a phase of the strobe signal outputted from the first delay circuit with a phase of the strobe signal outputted from the second delay circuit, wherein a delay amount of the first delay circuit is adjusted based on a comparison result of the first phase comparator, and a delay amount of the second delay circuit is adjusted based on a comparison result of the second phase comparator.

DETAILED DESCRIPTION

Figure 1:
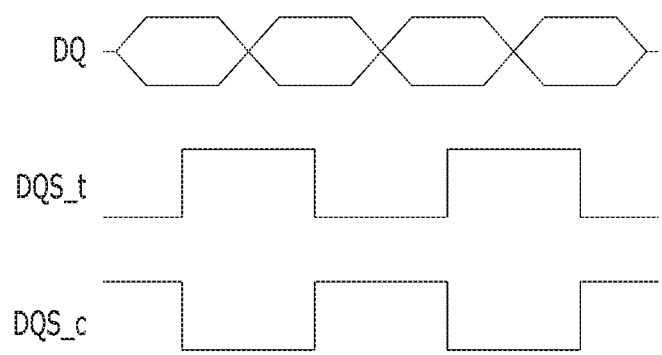
FIG. 1 is a timing diagram illustrating data and strobe signals.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

Figure 2:
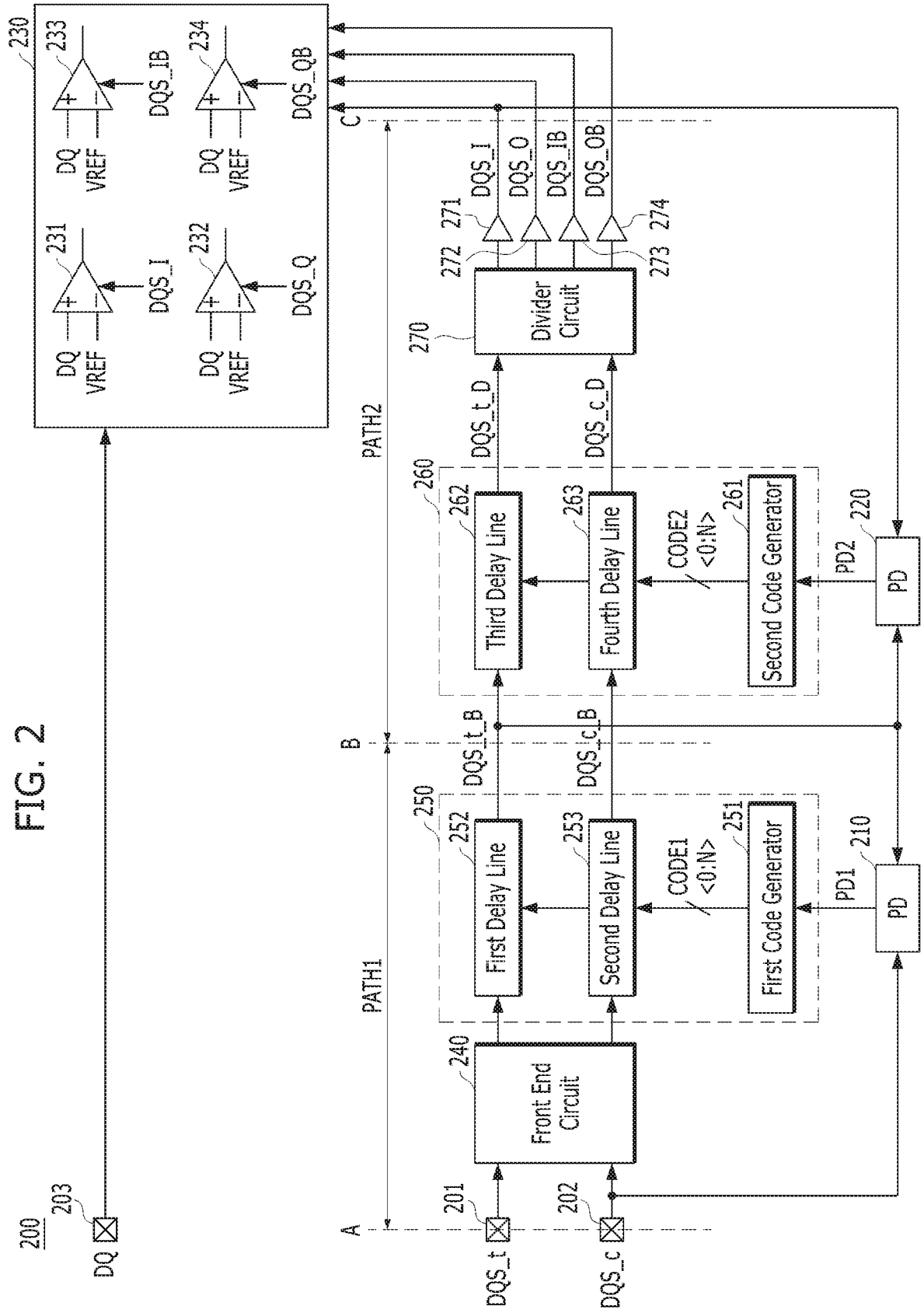
FIG. 2 is a block diagram illustrating a memory in accordance with an embodiment of the present invention.

FIG. 2 is a block diagram illustrating a memory 200 in accordance with an embodiment of the present invention.

Referring to FIG. 2, the memory 200 may include a first path PATH1, a second path PATH2, a first phase comparator 210, a second phase comparator 220, and a data receiving circuit 230.

The first path PATH1 may be a path of data strobe signals DQS_t and DQS_c transferred from a first point A to a second point B in the memory 200. The first point A may correspond to data strobe signal pads 201 and 202 through which the data strobe signals DQS_t and DQS_c are applied to the memory 200. The second point may be an intermediate point corresponding to an intermediate delay amount of the data strobe signals DQS_t and DQS_c. The data strobe signals may be differential signals including a positive data strobe signal (i.e., a first data strobe signal) DQS_t and a negative data strobe signal (i.e., a second data strobe signal) DQS_c which are complementary.

The first path PATH1 may include a front end circuit 240 and a first delay circuit 250. The front end circuit 240 may receive the positive data strobe signal DQS_t and the negative data strobe signal DQS_c from the data strobe signal pads 201 and 202, and extend the swing range (i.e., swing amplitude) of the data strobe signals DQS_t and DQS_c. Therefore, the data strobe signals DQS_t and DQS_c outputted from the front end circuit 240 may have a swing range greater than that of the data strobe signals DQS_t DQS_c at the data strobe signal pads 201 and 202. For reference, the front end circuit 240 may include interface circuits such as a CML buffer, duty cycle corrector, and a level shifter.

The first delay circuit 250 may delay the data strobe signals DQS_t and DQS_c to generate data strobe signals DQS_t_B and DQS_c_B. The delay value of the first delay circuit 250 may be adjusted according to a comparison result PD1 of the first phase comparator 210. The first delay circuit 250 may include a first code generator 251, a first delay line 252, and a second delay line 253. The first code generator 251 may increase or decrease a value of a first code CODE1<0:N> based on the comparison result PD1. The first delay line 252 may delay the positive data strobe signal DQS_t, and the second delay line 253 may delay the negative data strobe signal DQS_c. The delay values of the delay lines 252 and 253 may be determined according to the value of the first code CODE1<0:N>. Accordingly, the first delay line 252 and the second delay line 253 may have the same delay value.

The second path PATH2 may be a path of the data strobe signals and transferred from the second point B to a third point C. The third point C may correspond to the data receiving circuit 230. The data strobe signals DQS_t_B and DQS_c_B may have the divided forms DQS_I, DQS_Q, DQS_IB, and DQS_QB at the third point C.

The second path PATH2 may include a second delay circuit 260, and a divider circuit 270. The first and second delay circuits 250 and 260 are coupled in series. The second delay circuit 260 may delay the data strobe signals DQS_t_B and DQS_c_B to generate data strobe signals DQS_t_D and DQS_c_D. The delay value of the second delay circuit 260 may be adjusted according to a comparison result PD2 of the second phase comparator 220. The second delay circuit 260 may include a second code generator 261, a third delay line 262, and a fourth delay line 263. The second code generator 261 may increase or decrease a value of a second code CODE2<0:N> according to the comparison result PD2. The third delay line 262 may delay the data strobe signal DQS_t_B, and the fourth delay line 263 may delay the negative data strobe signal DQS_c_B. The delay values of the delay lines 262 and 263 may be determined based on the value of the second code CODE2<0:N>. Accordingly, the third delay line 262 and the fourth delay line 263 have the same delay value.

The divider circuit 270 may generate first to fourth divided data strobe signals DQS_I, DQS_Q, DQS_IB, and DQS_QB by dividing frequencies of the data strobe signals and DQS_t_D and DQS_c_D outputted from the second delay circuit 260. The first to fourth divided data strobe signals DQS_I, DQS_Q, DQS_IB and DQS_QB may have frequencies corresponding to a half (½) of the frequencies of the data strobe signals DQS_t_D and DQS_c_D. The first to fourth divided data strobe signals DQS_I, DQS_Q, DQS_IB, and DQS_QB may have a phase difference of approximately 90 degrees. That is, the second divided data strobe signal DQS_Q may have a phase difference of approximately 90 degrees with respect to the first divided data strobe signal DQS_I, and the third divided data strobe signal DQS_IB may have a phase difference of approximately 90 degrees with respect to the second divided data strobe signal DQS_Q. The fourth divided data strobe signal DQS_QB may have a phase difference of approximately 90 degrees with respect to the third divided data strobe signal DQS_IB. Drivers 271 to 274 may transfer the first to fourth divided data strobe signals DQS_I, DQS_IB and DQS_QB generated from the divider circuit 270 to the data receiving circuit 230, respectively.

The data receiving circuit 230 may receive the data DQ in response to the first to fourth divided data strobe signals DQS_I, DQS_Q, DQS_IB and DQS_QB at the third point C. The data receiving circuit 230 may include first to fourth receivers 231 to 234. The first to fourth receivers 231 to 234 may receive the data DQ externally transferred through the data pad 203 in response to the first to fourth divided data strobe signals DQS_I, DQS_Q, DQS_IB and DQS_QB. For example, the first receiver 231 may receive the data DQ by comparing a voltage level of the data DQ with a level of a reference voltage VREF at a rising edge of the first divided data strobe signal DQS_I. The third receiver 233 may receive the data DQ by comparing a voltage level of the data DQ with a level of the reference voltage VREF at a rising edge of the third divided data strobe signal DQS_Q. FIG. 2 shows a case where there are one data pad 203 and one data receiving circuit 230. However, it is apparent to those skilled in the art that there may be more data pads and more data receiving circuits.

The first phase comparator 210 may compare the edges of the data strobe signals DQS_t and DQS_c at the first point A with the edges of the data strobe signals DQS_t_B and DQS_c_B at the second point B. For example, the first phase comparator 210 may compare a phase of a rising edge of the negative data strobe signal DQS_c at the first point A with a phase of a rising edge of the positive data strobe signal DQS_t_B at the second point B, and may output the comparison result PD1. Although it is illustrated herein that the first phase comparator 210 compares a phase of a rising edge of the negative data strobe signal DQS_c at the first point A with a phase of a rising edge of the positive data strobe signal DQS_t_B at the second point B, the first phase comparator 210 may compare a rising edge or a falling edge of one signal between the positive data strobe signal DQS_t_and the negative data strobe signal DQS_c at the first point A with a rising edge or a falling edge of one signal between the positive data strobe signal DQS_t_B_and the negative data strobe signal DQS_c_B at the second point B. The first phase comparator 210 and the first delay circuit 250 may operate to lock the total delay value of the first path PATH1. That is, the first phase comparator 210 and the first delay circuit 250 may perform a role of making the first path PATH1 have a locked delay value, and there is no target delay value existing.

The second phase comparator 220 may compare the edges of the data strobe signals DQS_t_B and DQS_c_B at the second point B with the edges of the data strobe signals DQS_I, DQS_Q, DQS_IB and DQS_QB at the third point C. For example, the second phase comparator 220 may compare a phase of a falling edge of the positive data strobe signal DQS_t_B at the second point B with a phase of a rising edge of the first divided data strobe signal DQS_I at the third point C, and may output the comparison result PD2. Although it is illustrated herein that the second phase comparator 220 compares a phase of a falling edge of the positive data strobe signal DQS_t_B at the second point B with a phase of a rising edge of the first divided data strobe signal DQS_I at the third point C, the second phase comparator 220 may compare a rising edge or a falling edge of one signal between the positive data strobe signal DQS_t_B and the negative data strobe signal DQS_B at the second point B with a rising edge or a falling edge of one signal among the first to fourth divided data strobe signals DQS_I, DQS_Q, DQS_IB and DQS_QB at the third point C. The second phase comparator 220 and the second delay circuit 260 may operate to lock the total delay value of the second path PATH2. That is, the second phase comparator 220 and the second delay circuit 260 may only perform a role to make the second path PATH2 have a locked delay value, and there is no target delay value existing.

Since the delay value of the first path PATH1 may be locked through the operations of the first phase comparator 210 and the first delay circuit 250, and the delay value of the second path PATH2 is locked through the operations of the second phase comparator 220 and the second delay circuit 260, the delay value of the data strobe signals DQS_t and DQS_c transferred from the first point A to the third point C may be locked after all.

The delay value of the first path PATH1 and the delay value of the second path PATH2 may be separately locked by using the two phase comparators 210 and 220 and the two delay circuits 250 and 260. This is because it may be difficult to lock the delay values of the first path PATH1 and the second path PATH2 by using one phase comparator and one delay circuit. In order to lock the delay values of the first path PATH1 and the second path PATH2 by using one phase comparator and one delay circuit, the phases of the edges of the data strobe signals DQS_t and DQS_c at the first point A are required to be compared with the phases of the edges of the data strobe signals DQS_I, DQS_Q, DQS_IB, and DQS_QB at the third point C. However, since the data strobe signals DQS_t and DQS_c toggle only in a predetermined section which is not long, the data strobe signals DQS_t and DQS_c at the first point A and the data strobe signals DQS_I, DQS_Q, DQS_IB and DQS_QB at the third point C may not toggle at the same time (see FIG. 3). Thus, it may be difficult to compare the phases of the edges of the data strobe signals DQS_t and DQS_c at the first point A with the phases of the edges of the data strobe signals DQS_I, DQS_Q, DQS_IB, and DQS_QB at the third point C.

It is apparent to those skilled in the art that there may be more circuits of more various kinds on the first path PATH1 and the second path PATH2 if needed in addition to the front end circuit 240 and the divider circuit 270 illustrated in the figure.

Although FIG. 2 illustrates an example where the present invention for locking the delay value of a path through which signals are transferred is applied to the memory 200, it is apparent to those skilled in the art that the present invention may be also applicable to various integrated circuits other than the memory 200. The present invention may be used to lock the delay value of an input signal inputted to an integrated circuit chip.

Figure 3:
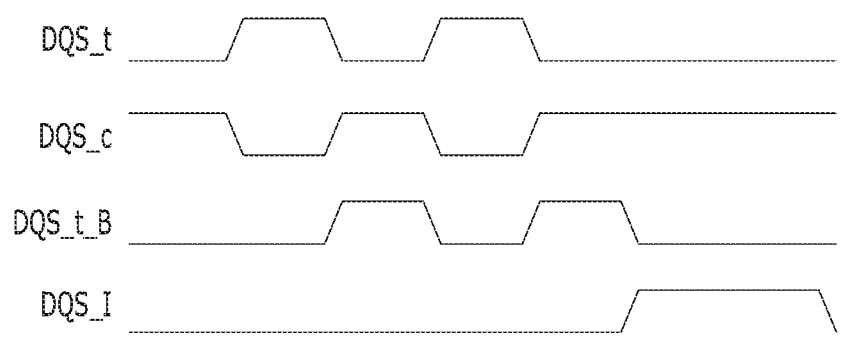
FIG. 3 is a timing diagram for describing an operation for locking a delay value of data strobe signals in the memory shown in FIG. 2.

FIG. 3 is a timing diagram for describing an operation for locking a delay value of data strobe signals in the memory shown in FIG. 2. Specifically, FIG. 3 illustrates that the delay values of the data strobe signals in the first path PATH1 and the second path PATH2 are locked through the operations of the first phase comparator 210, the first delay circuit 250, the second phase comparator 220, and the second delay circuit 260.

Each of the data strobe signals shown in FIG. 3 toggles in a form of a periodic wave in a first section, and has a predetermined fixed level in a second section.

Referring to FIG. 3, it may be seen that a phase of a rising edge of the negative data strobe signal DQS_c at the first point A and a phase of a rising edge of the positive data strobe signal DQS_t_B at the second point B are the same. This is because the delay value of the first delay circuit 250 may be decreased when the phase of the rising edge of the negative data strobe signal DQS_c at the first point A is faster than the phase of the rising edge of the positive data strobe signal DQS_t_B at the second point B and the delay value of the first delay circuit 250 may be increased when the phase of the rising edge of the negative data strobe signal DQS_c at the first point A is slower than the phase of the rising edge of the positive data strobe signal DQS_t_B at the second point B through the operations of the first phase comparator 210 and the first delay circuit 250.

It may also be seen that a phase of a falling edge of the positive data strobe signal DQS_t_B at the second point B and a phase of a rising edge of the first divided data strobe signal DQS_I at the third point C are the same. This is because the delay value of the second delay circuit 260 may be decreased when the phase of the falling edge of the positive data strobe signal DQS_t_B at the second point B is faster than the phase of the rising edge of the first divided data strobe signal DQS_I at the third point C, and the delay value of the second delay circuit 260 may be increased when the phase of the falling edge of the positive data strobe signal DQS_t_B at the second point B is faster than the phase of the rising edge of the first divided data strobe signal DQS_I at the third point C through the operations of the second phase comparator 220 and the second delay circuit 260.

Accordingly, even though the PVT conditions in the memory 200 are changed, the delay values of the first path PATH1 and the second path PATH2 may always be kept uniformly due to the operations of the first phase comparator 210, the first delay circuit 250, the second phase comparator 220 and the second delay circuit 260. The alignment between data strobe signals DQS_t and DQS_c and the data DQ may be secured even though the PVT conditions in the memory 200 are changed after the data strobe signals DQS_t and DQS_c and the data DQ are aligned through a training operation by the memory controller.

For reference, referring to FIG. 3, it may be seen that there is no section in which the data strobe signals DQS_t and DQS_c at the first point A and the data strobe signal DQS_I at the third point C simultaneously toggle. Therefore, as described above, the phases of the data strobe signals at the first point A and the third point C may not be directly compared with each other.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
   a first path suitable for transferring an input signal from a first point to a second point;
   a second path suitable for transferring the input signal at the second point to a third point;
   a first phase comparator suitable for comparing an edge of the input signal at the first point with an edge of the input signal at the second point; and
   a second phase comparator suitable for comparing an edge of the input signal at the second point with an edge of the input signal at the third point,
   wherein the first path includes a first delay circuit whose delay value is adjusted based on a comparison result of the first phase comparator,
   the second path includes a second delay circuit whose delay value is adjusted based on a comparison result of the second phase comparator,
   the first and second delay circuits are coupled in series to sequentially delay the input signal,
   the input signal is a differential signal including a first input signal and a second input signal which are complementary,
   the first and second input signals at the third point are divided into signals having different phases, and
   the second path further includes a divider circuit suitable for dividing a frequency of the first and second input signals at the third point to generate four divided input signals.

2. The integrated circuit of claim 1, wherein the input signal toggles in a form having a periodic wave in a first section, and has a predetermined fixed level in a second section.

3. The integrated circuit of claim 1, wherein the first path further includes a front end circuit suitable for receiving the first input signal and the second input signal, and extending a swing range of the first and second input signals.

4. A memory, comprising:
   a first path suitable for transferring a first data strobe signal and a second data strobe signal from a first point to a second point;
   a second path suitable for transferring the first and second data strobe signals at the second point to a third point;
   a first phase comparator suitable for comparing an edge of one strobe signal between the first data strobe signal and the second data strobe signal at the first point with an edge of one strobe signal between the first data strobe signal and the second data strobe signal at the second point;
   a second phase comparator suitable for comparing an edge of one strobe signal between the first data strobe signal and the second data strobe signal at the second point with an edge of one strobe signal among the first and second data strobe signals at the third point;
   a data receiving circuit suitable for receiving data based on the first and second data strobe signals at the third point; and
   wherein the first path includes a first delay circuit whose delay value is adjusted based on a comparison result of the first phase comparator,
   the second path includes a second delay circuit whose delay value is adjusted based on a comparison result of the second phase comparator,
   the first and second delay circuits are coupled in series, and sequentially delay the first and second data strobe signals to provide the data receiving circuit with the first and second data strobe signals,
   the second path further includes a divider circuit suitable for dividing a frequency of the first and second data strobe signals at the third point to generate first to fourth divided data strobe signals.

5. The memory of claim 4, wherein the first and second data strobe signals toggle in a form of a periodic wave in a section where the data are applied to the memory, and have a fixed predetermined level in the other sections.

6. The memory of claim 4, wherein the first path further includes a front end circuit suitable for receiving the first data strobe signal and the second data strobe signal, and extending a swing range of the first and second data strobe signals.

7. The memory of claim 4, wherein the data receiving circuit receives the data based on the first to fourth divided data strobe signals.

8. A memory, comprising:
   a data pad and a data strobe signal pad;
   a data receiving circuit suitable for receiving data externally received through the data pad based on a data strobe signal;
   first and second delay circuits coupled in series, suitable for sequentially delaying the data strobe signal externally received through the data strobe signal pad to generate the data strobe signal provided to the data receiving circuit;
   a first phase comparator suitable for comparing a phase of the strobe signal at the data strobe signal pad with a phase of the strobe signal outputted from the first delay circuit;
   a second phase comparator suitable for comparing a phase of the strobe signal outputted from the first delay circuit with a phase of the strobe signal outputted from the second delay circuit; and
   a divider circuit suitable for dividing a frequency of the data strobe signal to generate divided data strobe signals having different phases,
   wherein a delay amount of the first delay circuit is adjusted based on a comparison result of the first phase comparator, and a delay amount of the second delay circuit is adjusted based on a comparison result of the second phase comparator.

9. The memory of claim 8, wherein the data receiving circuit receives the data based on the divided data strobe signals.

* * * * *